United States Patent [19]

Okazawa

[11] Patent Number: 5,371,704
[45] Date of Patent: Dec. 6, 1994

[54] NONVOLATILE MEMORY DEVICE WITH COMPENSATION FOR OVER-ERASING OPERATION

[75] Inventor: Takeshi Okazawa, Tokyo, Japan

[73] Assignee: NEC Corporation, Tokyo, Japan

[21] Appl. No.: 157,568

[22] Filed: Nov. 26, 1993

[30] Foreign Application Priority Data

Nov. 26, 1992 [JP] Japan .................................. 4-337880

[51] Int. Cl.⁵ .......................................... G11C 13/00
[52] U.S. Cl. ...................................... 365/185; 365/51; 365/182
[58] Field of Search .................. 365/185, 51, 149, 182

[56] References Cited

U.S. PATENT DOCUMENTS 3,660,819  5/1972  Frohman-Bentchkousky .... 365/185
4,864,374  9/1989  Banertee ............................. 365/185

OTHER PUBLICATIONS

K. Naruke et al., "A New Flash–Erase EEPROM Cell with a Sidewall Select–Gate on Its Source Side", IEDM Tech. Digest, 1989, pp. 603–606.

Primary Examiner—Terrell W. Fears
Attorney, Agent, or Firm—Sughrue, Mion, Zinn, Macpeak & Seas

[57] ABSTRACT

A groove is formed in a semiconductor layer, and a source region is formed at a part of the groove within the semiconductor layer. A control gate is buried via a first insulating layer within the groove. A floating gate is formed via a second insulating layer on the control gate. The floating gate extends over the first insulating layer. A drain region is formed within the semiconductor layer apart from the groove.

9 Claims, 6 Drawing Sheets

NONVOLATILE MEMORY DEVICE WITH COMPENSATION FOR OVER-ERASING OPERATION

BACKGROUND OF THE INVENTION

1. Field of the Invention

The present invention relates to a nonvolatile memory device such as an electrical erasable and programable read only memory (EEPROM), and more particularly, to a nonvolatile memory device with compensation for an over-erasing operation.

2. Description of the Related Art

Generally, an EEPROM cell includes a P-type semiconductor substrate having an N+-type source region and an N+-type drain region, a floating gate via an insulating layer on the semiconductor substrate between the source region and the drain region, and a control gate via another insulating layer on the floating gate. In a write mode, a high positive voltage is applied to the drain region and another high positive voltage is applied to the control gate while the source region is grounded. As a result, hot electrons having an energy larger than an energy barrier of the insulating layer between the floating gate and the semiconductor substrate are introduced into the floating gate, thus completing a writing operation. In this case, the threshold voltage of the EEPROM cell is made higher. On the other hand, in an erase mode, a high positive voltage is applied to the drain region and the control gate is grounded. As a result, the electrons stored in the floating gate are extracted therefrom to the drain region utilizing the Fowler-Nordheim tunneling effect. To realize the Fowler-Nordheim tunneling effect, the insulating layers are made very thin.

In the above-mentioned erase mode, however, when more electrons than those introduced in a write mode are extracted from the floating gate, the threshold voltage of the EEPROM cell may be made negative, i.e., the EEPROM cell becomes a depletion type transistor. Such an erasing operation is called an over-erasing operation.

In order to compensate for such an over-erasing operation, there has been known an EEPROM cell having a selection gate (see: K. Naruke et al.: "A NEW FLASH-ERASE EEPROM CELL WITH SIDEWALL SELECT-GATE ON ITS SOURCE SIDE", IDEM Tech. Digest, 1989, pp. 603-606). This prior art EEPROM cell is, however, disadvantageous in terms of integration and characteristics, which will be explained later in detail.

SUMMARY OF THE INVENTION

It is an object of the present invention to provide a nonvolatile memory device which can be highly integrated and can have excellent characteristics.

According to the present invention, a groove is formed in a semiconductor layer, and a source region is formed at a part of the groove within the semiconductor layer. A control gate is buried via a first insulating layer within the groove. A floating gate is formed via a second insulating layer on the control gate. The floating gate extends over the first insulating layer. A drain region is formed within the semiconductor layer apart from the groove. Thus, an EEPROM cell is completed.

In the above-mentioned EEPROM, even when an over-erasing operation is carried out to extract more carriers stored in the floating gate than those introduced in a write mode, so that a channel is always generated in the semiconductor layer beneath the floating gate, no channel is generated in a region of the semiconductor layer adjacent to the control gate when no voltage is applied thereto. Thus, the over-erasing operation is compensated for.

BRIEF DESCRIPTION OF THE DRAWINGS

The present invention will be more clearly understood from the description as set forth below, in comparison with the prior art, with reference to the accompanying drawings, wherein.

DESCRIPTION OF THE PREFERRED EMBODIMENTS

Before the description of embodiments, a prior art EEPROM cell will be explained with reference to FIG. 1 (see: the above-mentioned document).

Figure 1:
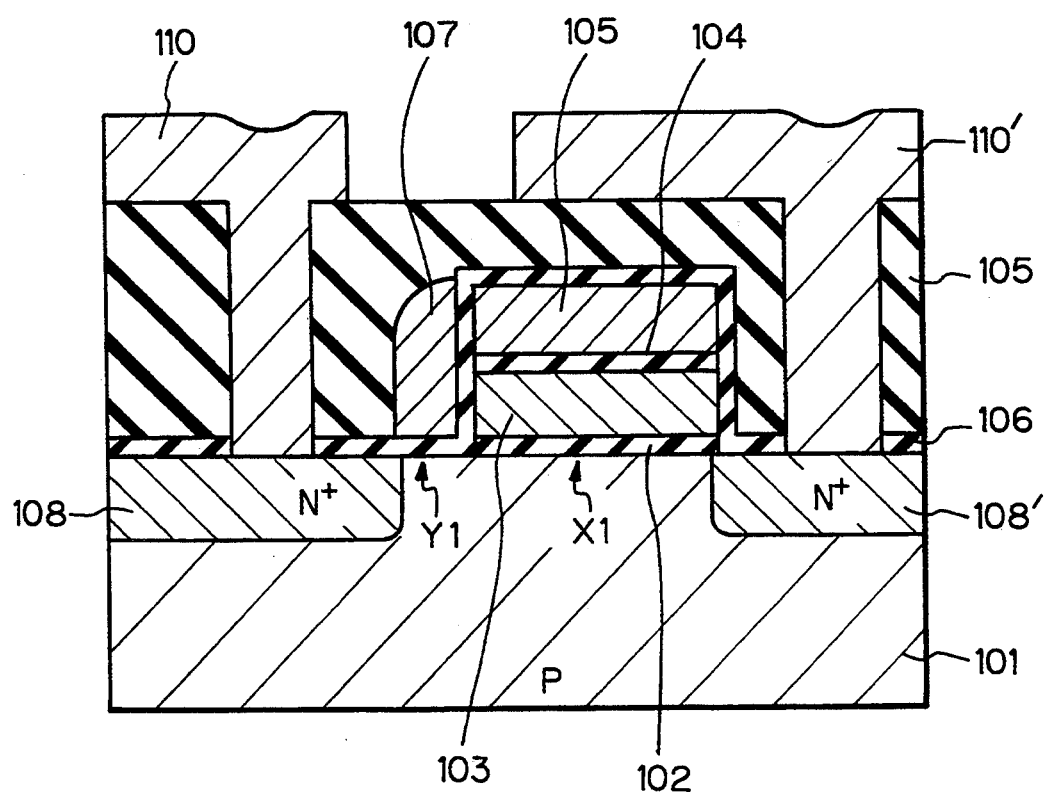
FIG. 1 is a cross-sectional view illustrating a prior art EEPROM cell.

In FIG. 1, reference numeral 1 designates a P-type semiconductor substrate on which an insulating layer 102 is formed. A floating gate 103 is formed on the insulating layer 102. Also, an insulating layer 104 is formed on the floating gate 103, and a control gate 105 is formed on the insulating layer 104. Also, an insulating layer 106 is formed on the control gate 105 and the semiconductor substrate 101. Thus, the semiconductor substrate 101, the floating gate 103 and the control gate 105 are electrically isolated from each other.

Further, a selection gate 107 is formed on the insulating layer 106 on one side of the floating gate 103 and the control gate 105. In this state, N-type impurities are introduced into the semiconductor substrate 101 in self-alignment with the floating gate 103 (the control gate 105) and the selection gate 107, to thereby create N+-type impurity regions, i.e., a source region 108 and a drain region 108'.

Note that reference numeral 109 designates a layer insulating layer, and 110 and 110' designate metal connection layers connected to the source region 108 and the drain region 108', respectively.

The voltage at the selection gate 107 is controlled in connection with the voltage at the control gate 105, and accordingly, the EEPROM cell of FIG. 1 can be turned ON and OFF in spite of whether or not a charge is stored in the floating gate 103.

The operation of the EEPROM cell will be explained below.

In a write mode, a high positive voltage such as 7 V is applied to the drain region 108' and another high voltage such as 12 V is applied to the control gate 105 while the source region 108 is grounded. As a result, hot electrons are generated in the vicinity of the drain region 108', and accordingly, the hot electrons having energy larger than an energy barrier of the insulating layer 102 are introduced into the floating gate 103, thus completing a write operation. In this case, during a read mode, even when a voltage is applied to the control gate 105, electrical lines are terminated by the electrons stored in the floating gate 105, so that formation of a channel on the surface of the semiconductor substrate 101 is prevented. That is, the threshold voltage of the MOS transistor (EEPROM cell) is shifted in a positive direction, thus enabling a storage operation.

On the other hand, in an erase mode, a high positive voltage such as 12 V is applied to the drain region 108', while the control gate 105 and the source region 108 are grounded. As a result, the electrons stored in the floating gate 103 are extracted therefrom to the drain region 108' utilizing the Fowler-Nordheim tunnelling effect. To realize the Fowler-Nordheim tunnelling effect, the insulating layers 102 and 104 are both made about 120 Å thick. Therefore, when a voltage of 12 V is applied to the drain region 108', an electric field of approximately 5 MV/cm is created in the insulating layer 102, to thereby realize such a tunnelling effect.

In the above-mentioned erase mode, an over-erasing operation may occur. That is, when the control of the tunnelling current is not going well, more electrons than those stored in the write mode may be extracted. When this over-erasing operation occurs, it is impossible to restore the EEPROM cell to a state that existed before the write operation was carried out. At worst, the threshold voltage of the EEPROM cell becomes negative, so that the EEPROM cell is conductive even when the control gate 105 is grounded. In other words, even when the control gate 105 is grounded, a channel is generated on a surface X1 of the semiconductor substrate 101 beneath the floating gate 103. In order to prevent the EEPROM cell from being such a depletion MOS transistor, the selection gate 107 is provided. As a result, even if a channel should be generated on the surface X1 of the semiconductor substrate 101 in spite of the charge in the floating gate 103, no channel is ever generated on a surface Y1 of the semiconductor substrate 101 as long as the selection gate 107 is grounded. Thus, an over-erasing operation can be compensated for by applying the ground voltage to the selection gate 107.

In the EEPROM cell of FIG. 1, however, since the selection gate 107 is formed on a sidewall of the floating gate 103 and the control gate 105, the EEPROM cell needs to be large in a lateral direction. Also, an electrode and a connection layer connected to the selection gate 107 are required, to thereby reduce the integration of the device.

Further, when forming this selection gate 107, a self-alignment method is adopted for the sidewall of the control gate 105. However, a step for manufacturing the sidewall by anistropic etching is unstable, so that a precise dimension of the sidewall cannot be obtained, thus exhibiting an unstable characteristic.

Figure 2:
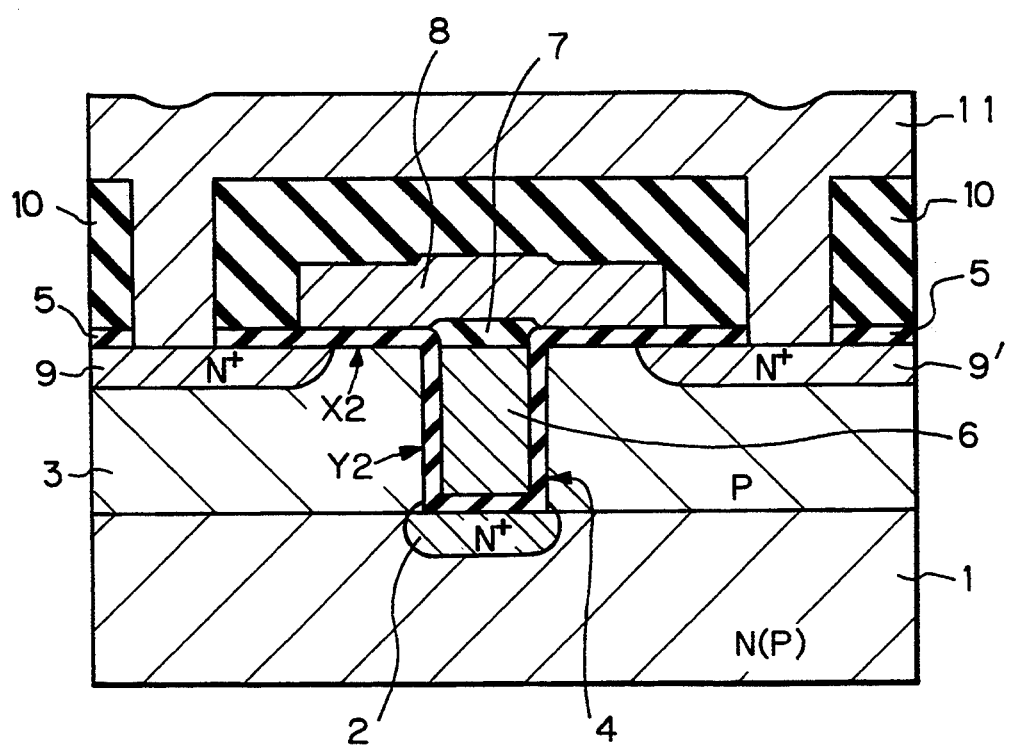
FIG. 2 is a cross-sectional view illustrating a first embodiment of the nonvolatile memory device according to the present invention.

In FIG. 2, which illustrates a first embodiment of the present invention, reference numeral 1 designates a monocrystalline silicon substrate which may be an N-type or a P-type. Formed in the semiconductor substrate 1 is an N+-type source region 2. Also, formed on the silicon substrate 1 is a P-type monocrystalline silicon layer 3. An opening 4 is formed through the silicon layer 3 and reaches the source region 2, so that this opening 4 serves as a groove. An insulating layer 5 made of silicon dioxide is formed within the groove 4 and extends over the silicon substrate 1.

A control gate 6 is buried within the groove 4. also, formed on the control gate 6 is an insulating layer 7. A floating gate 8 is formed on the insulating layer 7 and extends over the insulating layer 5.

Also, N+-type drain regions 9 and 9' are formed within the silicon substrate 101 apart from the groove 4. Then, a layer insulating layer 10 is formed on the entire surface, and after contact holes are formed on the layer insulating layer 10, a metal connection layer 11 is formed and connected to the drain regions 9 and 9'.

In the EEPROM cell of FIG. 2, since the control gate 6 adjacent to the source 2 is effectively operated, even when an excess of electrons are extracted from the floating gate 8, it is possible to control a channel in the vicinity of the source region 2. In more detail, even if a channel is generated on a surface X2 of the silicon substrate 1 in spite of the charge in the floating gate 8, no channel is ever generated on a surface Y2 of the silicon substrate 1 as long as that the control gate 6 is grounded. Thus, an over-erasing operation can be compensated for by applying the ground voltage to the control gate 6.

Therefore, the selection gate 107 of FIG. 1 is unnecessary, so that the area of the device is reduced to enable a high integration of the device. Also, the step for forming the sidewall for the selection gate is unnecessary, and therefore, unstable elements in the manufacturing steps are absent, thus enabling a stable characteristic.

Note that, if the conductivity type of the silicon substrate 1 is the same as that of the source region 2, a voltage for the source region 2 can be derived from the silicon substrate 1, i.e., a lower surface thereof. Contrary to this, if the conductivity type of the silicon substrate 1 is opposite to that of the source region 2, a voltage for the source region 2 can be derived from an upper surface of the silicon substrate 1 via a contact hole.

The manufacturing steps for the EEPROM cell of FIG. 2 will be explained next with reference to FIGS. 3A through 3E.

Figure 3A:
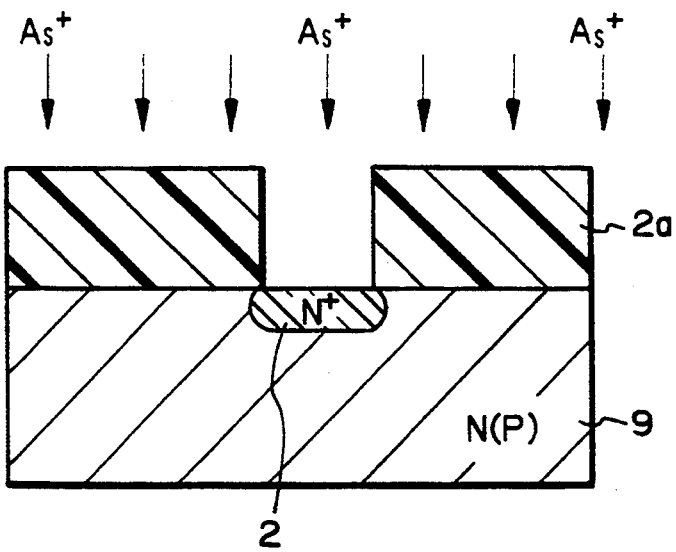
FIGS. 3A, 3B, 3C, 3D and 3E are cross-sectional views explaining the manufacturing steps of the nonvolatile memory device of FIG. 2.

As illustrated in FIG. 3A, a photoresist layer 2$a$ is coated on a monocrystalline silicon substrate 1 which may be an N-type including impurities such as phosphorus atoms or arsenic atoms having a density of $10^{16}$ cm$^{-3}$. Then, the photoresist layer 2$a$ is patterned by conventional photolithography process. Then, $5 \times 10^{15}$ arsenic ions (As+) per square cm at 50 KeV are implanted into the silicon substrate 1 with a mask of the patterned photoresist layer 2$a$, to form an N+-type source region 2.

Figure 3B:
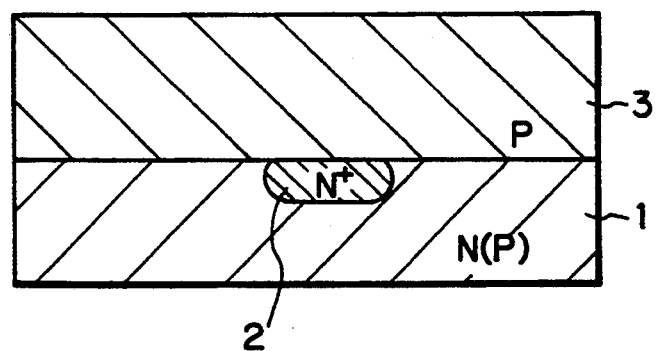

Next, as illustrated in FIG. 3B, the photoresist layer 2$a$ is removed. Then, an about 0.8 to 1.0 μm thick P-type monocrystalline silicon layer 3 is grown by molecular beam epitaxial (MBE) method on the silicon substrate 1. Note that the P-type monocrystalline silicon layer 3 includes impurities such as $10^{17}$ to $10^{18}$ boron atoms per cubic cm. Also, since this MBE method is carried out at a temperature of about 700° C., a thermal diffusion hardly occurs in the source region 2.

Figure 3C:
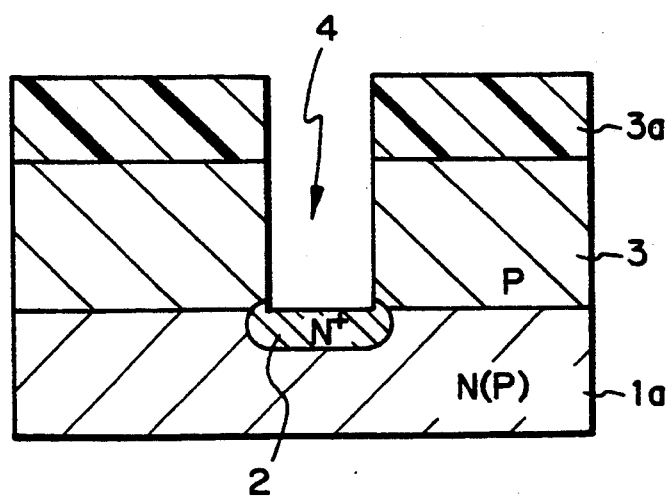

Next, as illustrated in FIG. 3C, a photoresist layer 3$a$ is coated on the entire surface, and is patterned by conventional photolithography process. Then, the monocrystalline silicon layer 3 is etched with a mask of the patterned photoresist layer 3$a$, to create an opening 4, i.e., a groove 4 which leads to the source region 2.

Figure 3D:
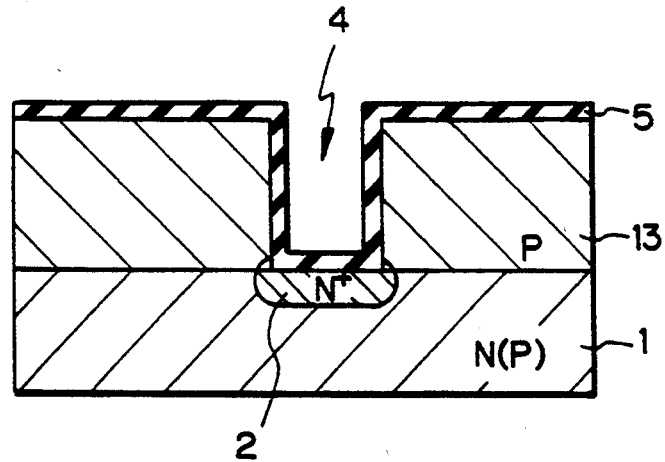

Next, as illustrated in FIG. 3D, the photoresist layer 3a is removed. Then, an insulating layer about 100 Å thick and made of silicon dioxide is formed by thermal oxidation of the silicon substrate 1 and the monocrystalline silicon layer 3 or by chemical vapor deposition (CVD) process.

Figure 3E:
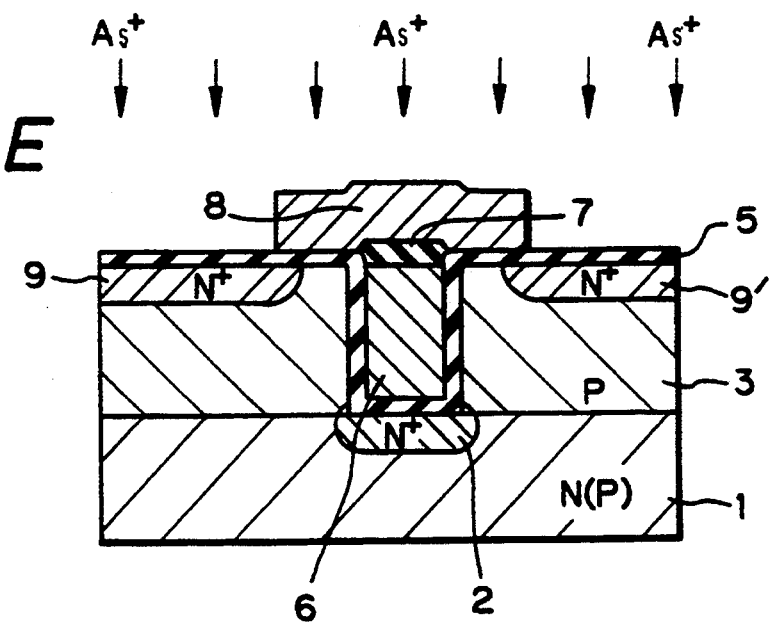

Next, as illustrated in FIG. 3E, polycrysralline silicon including about $10^{20}$ phosphorus atoms per cubic cm is deposited by CVD process, and is etched back to obtain a control gate 6 buried within the groove 4. Then, an insulating layer 7 is deposited on the control gate 6. For example, the insulating layer 7 is made of a triple layer formed by a 150 Å thick silicon nitride layer sandwiched by a 100 Å thick silicon dioxide layer and a 40 Å thick silicon dioxide layer. Then, polycrysralline silicon including about $10^{19}$ to $10^{20}$ phosphorus atoms per cubic cm is deposited by CVD process, and is etched by conventional photolithography process, to obtain a floating gate 8. This floating gate 8 is formed on the control gate 6 and extends over the insulating layer 5. After that, $5 \times 10^{15}$ arsenic ions (As+) per square cm at 70 KeV are implanted in self-alignment with the floating gate 7, to obtain N+-type drain regions 9 and 9'.

Then, a layer insulating layer 10 and a metal connection layer 11 are formed by conventional CVD process and photolithography process, to obtain the EEPROM cell of FIG. 2.

Figure 4:
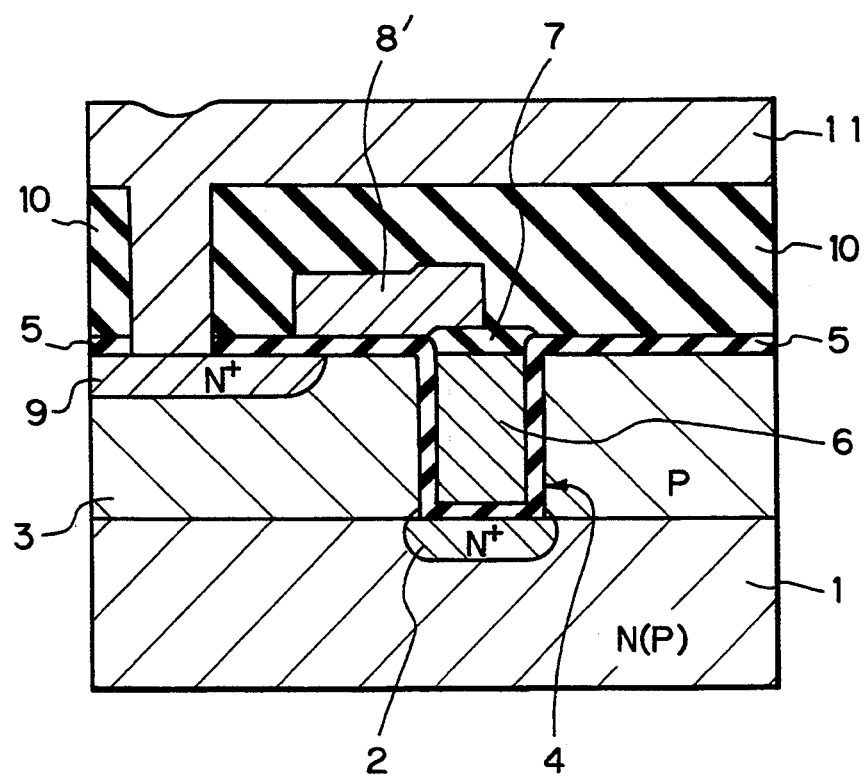
FIG. 4 is a cross-sectional view illustrating a second embodiment of the nonvolatile memory device according to the present invention.
Figure 5:
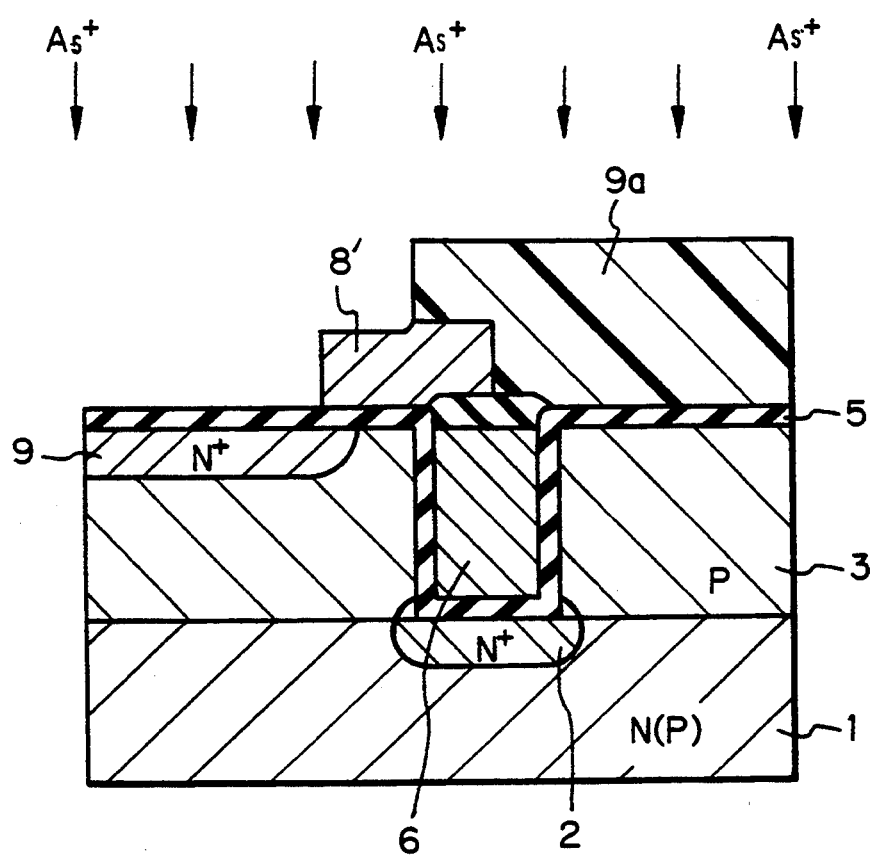
FIG. 5 is a cross-sectional view explaining the manufacturing steps of the nonvolatile memory device of FIG. 4.

In FIG. 4, which illustrates a second embodiment of the present invention, a floating gate 8' is formed only on one side of the control gate 6, and only the drain region 9 is formed only on the side of the floating gate 8'. As a result, although the manufacturing steps are the same as those illustrated in FIGS. 3A through 3D, when implanting impurities into the monocrystalline silicon layer 3 for the drain region 9, a step for masking the other side of the floating gate 8' with a photoresist layer 9a as illustrated in FIG. 5 is required. However, since the drain region 9 is provided only on one side, the integration can be enhanced as compared with the first embodiment as illustrated in FIG. 2.

Although the above-mentioned embodiments illustrate an N-type MOS transistor EEPROM cell, the present invention can be applied to a P-type MOS transistor EEPROM cell.

As explained hereinbefore, according to the present invention, since an opening or groove is formed within a semiconductor layer for burying a control gate therein and a source region is provided at a part of the groove, a channel adjacent to the source region can be controlled by the voltage at the control gate in spite of a charge stored in a floating gate, thus compensating for an over-erasing operation. Also, the selection gate, which was necessary in the prior art, is unnecessary, thus improving the integration of the device. Further, the step for forming the sidewall for the selection gate is unnecessary, thus realizing a stable characteristic.

I claim:
1. A nonvolatile memory device comprising:
   a semiconductor layer of a first conductivity type having a groove;
   a source region of a second conductivity type opposite to the first conductivity type, formed within said semiconductor layer at a part of said groove;
   a control gate buried within said groove;
   a first insulating layer interposed between said control gate and said semiconductor layer;
   a second insulating layer formed over said control gate;
   a third insulating layer formed over said semiconductor layer;
   a floating gate formed over said second and third insulating layers; and
   at least one drain region of the second conductivity type formed within said semiconductor layer apart from said groove.

2. A device as set forth in claim 1, wherein said drain region is manufactured in self-alignment with said floating gate.

3. A device as set forth in claim 1, wherein said first insulating layer is manufactured simultaneously with said third insulating layer on said semiconductor layer.

4. A nonvolatile memory device comprising:
   a semiconductor substrate of a first conductivity type;
   a source region of the first conductivity type, formed with said semiconductor substrate;
   a semiconductor layer of a second conductivity type opposite to the first conductivity type, formed on said semiconductor substrate, said semiconductor layer having an opening leading to said source region;
   a control gate buried within said opening;
   a first insulating layer interposed among said control gate, said semiconductor substrate and said semiconductor layer;
   a second insulating layer formed over said control gate;
   a floating gate formed over said first and second insulating layers; and
   at least one drain region of the first conductivity type formed within said semiconductor layer apart from said opening.

5. A device as set forth in claim 4, wherein said drain region is manufactured in self-alignment with said floating gate.

6. A device as set forth in claim 4, wherein said drain region is manufactured simultaneously with said third insulating layer.

7. A nonvolatile memory device comprising:
   a semiconductor substrate of a first conductivity type;
   a source region of a second conductivity type opposite to the first conductivity type, formed with said semiconductor substrate;
   a semiconductor layer of the first conductivity type, formed on said semiconductor substrate, said semiconductor layer having an opening leading to said source region;
   a control gate buried within said opening;
   a first insulating layer interposed among said control gate, said semiconductor substrate and said semiconductor layer;
   a second insulating layer formed over said control gate;
   a floating gate formed over said first and second insulating layers, and
   at lease one drain region of the second conductivity type formed within said semiconductor layer apart from said opening.

8. A device as set forth in claim 7, wherein said drain region is manufactured in self-alignment with said floating gate.

9. A device as set forth in claim 7, wherein said first insulating layer is manufactured simultaneously with said third insulating layer on said semiconductor layer.

* * * * *